(12) United States Patent
Lee et al.

(10) Patent No.: US 8,896,070 B2
(45) Date of Patent: Nov. 25, 2014

(54) PATTERNING EMBEDDED CONTROL LINES FOR VERTICALLY STACKED SEMICONDUCTOR ELEMENTS

(75) Inventors: Hyung-Kyu Lee, Edina, MN (US); YoungPil Kim, Eden Prairie, MN (US); Peter Nicholas Manos, Eden Prairie, MN (US); Maroun Khoury, Burnsville, MN (US); Dadi Setiadi, Edina, MN (US); Chulmin Jung, Edina, MN (US); Hsing-Kuen Liou, Plymouth, MN (US); Paramasiyan Kamatchi Subramanian, Edina, MN (US); Yongchul Ahn, Eagan, MN (US); Jinyoung Kim, Edina, MN (US); Antoine Khoueir, Apple Valley, MN (US)

(73) Assignee: Seagate Technology LLC, Cupertino, CA (US)

( * ) Notice: Subject to any disclaimer, the term of this patent is extended or adjusted under 35 U.S.C. 154(b) by 100 days.

(21) Appl. No.: 13/446,462

(22) Filed: Apr. 13, 2012

(65) Prior Publication Data

US 2012/0199915 A1 Aug. 9, 2012

Related U.S. Application Data

(62) Division of application No. 12/502,178, filed on Jul. 13, 2009, now Pat. No. 8,183,126.

(51) Int. Cl.
| | |
|---|---|
| *H01L 45/00* | (2006.01) |
| *H01L 27/24* | (2006.01) |
| *H01L 27/22* | (2006.01) |
| *H01L 43/08* | (2006.01) |
| *H01L 27/10* | (2006.01) |

(52) U.S. Cl.
CPC ............ *H01L 27/101* (2013.01); *H01L 45/085* (2013.01); *H01L 27/2454* (2013.01); *H01L 45/04* (2013.01); *H01L 45/1233* (2013.01); *H01L 27/2463* (2013.01); *H01L 27/228* (2013.01); *H01L 45/1675* (2013.01); *H01L 43/08* (2013.01)

USPC .................................. 257/379; 257/E27.081

(58) Field of Classification Search
CPC ................ H01L 21/84; H01L 27/1203; H01L 21/76254; H01L 29/045; H01L 2924/00
USPC ............ 257/379, E27.081, E21.087; 438/455
See application file for complete search history.

(56) References Cited

U.S. PATENT DOCUMENTS

| | | | |
|---|---|---|---|
| 4,232,057 | A | 11/1980 | Ray |
| 4,323,589 | A | 4/1982 | Ray |

(Continued)

OTHER PUBLICATIONS

Londergan, Ana R. et al., "Interlayer Mediated Epitaxy of Cobalt Silicide on Silicon (100) from Low Temperature Chemical Vapor Deposition of Cobalt," *Journal of the Electrochemical Society*, 2001, pp. C21-C27, 148(1), The Electrochemical Society, Inc., U.S.

*Primary Examiner* — Tony Tran
(74) *Attorney, Agent, or Firm* — Mueting, Raasch & Gebhardt P.A.

(57) ABSTRACT

The present invention is generally directed to an apparatus with embedded (bottom side) control lines for vertically stacked semiconductor elements. In accordance with various embodiments, a first semiconductor wafer is provided with a first facing surface on which a first conductive layer is formed. The first semiconductor wafer is attached to a second semiconductor wafer to form a multi-wafer structure, the second semiconductor wafer having a second facing surface on which a second conductive wafer is formed. The first conductive layer is contactingly bonded to the second conductive layer to form an embedded combined conductive layer within said structure. Portions of the combined conductive layer are removed to form a plurality of spaced apart control lines that extend in a selected length or width dimension through said structure.

15 Claims, 10 Drawing Sheets

(56) References Cited

U.S. PATENT DOCUMENTS

| | | | |
|---|---|---|---|
| 5,330,935 | A | 7/1994 | Dobuzinsky |
| 5,412,246 | A | 5/1995 | Dobuzinsky |
| 5,443,863 | A | 8/1995 | Neely et al. |
| 6,100,166 | A | 8/2000 | Sakaguchi |
| 6,346,477 | B1 | 2/2002 | Kaloyeros |
| 6,376,332 | B1 | 4/2002 | Yanagita |
| 6,534,382 | B1 | 3/2003 | Sakaguchi |
| 7,052,941 | B2 | 5/2006 | Lee |
| 7,273,638 | B2 | 9/2007 | Belyansky |
| 7,378,702 | B2 | 5/2008 | Lee |
| 7,381,595 | B2 | 6/2008 | Joshi |
| 7,470,142 | B2 | 12/2008 | Lee |
| 7,470,598 | B2 | 12/2008 | Lee |
| 2002/0081822 | A1 | 6/2002 | Yanagita |
| 2005/0092526 | A1 | 5/2005 | Fielder |
| 2005/0218521 | A1 | 10/2005 | Lee |
| 2005/0280154 | A1 | 12/2005 | Lee |
| 2005/0280155 | A1 | 12/2005 | Lee |
| 2005/0280156 | A1 * | 12/2005 | Lee ................. 257/758 |
| 2006/0275962 | A1 | 12/2006 | Lee |
| 2007/0077694 | A1 | 4/2007 | Lee |
| 2007/0281439 | A1 | 12/2007 | Bedell |
| 2008/0032463 | A1 | 2/2008 | Lee |
| 2008/0038902 | A1 | 2/2008 | Lee |
| 2008/0048327 | A1 | 2/2008 | Lee |
| 2008/0191312 | A1 | 8/2008 | Oh |
| 2008/0265360 | A1 | 10/2008 | Lee |
| 2010/0264396 | A1 * | 10/2010 | Lung et al. ............ 257/3 |

\* cited by examiner

ETCH DOWN TO METAL LAYER TO FORM PILLARS

PATTERNING EMBEDDED CONTROL LINES FOR VERTICALLY STACKED SEMICONDUCTOR ELEMENTS

RELATED APPLICATIONS

This application is divisional application of U.S. patent application Ser. No. 12/502,178 filed Jul. 13, 2009. The entire disclosure of this application is incorporated herein by reference.

BACKGROUND

Solid state memories (SSMs) provide an efficient mechanism for storing and transferring data in a wide variety of applications, such as hand-held portable electronic devices. Individual memory cells within such memories can be volatile or non-volatile, and can store data by the application of suitable write currents to the cells to store a sequence of bits. The stored bits can be subsequently read during a read access operation by applying suitable read currents and sensing voltage drops across the cells.

Some SSM cell configurations employ a memory element coupled to a channel based switching device such as a metal oxide semiconductor field effect transistor (MOSFET). The switching device provides selective access to the memory element during read and write operations. Examples of memory cells with this type of memory element-switching device arrangement include, but are not limited to, volatile dynamic random access memory (DRAM), non-volatile resistive random access memory (RRAM), and non-volatile spin-torque transfer random access memory (STRAM).

While operable, a limitation with the use of MOSFETs and other types of switching devices in a memory cell is the areal extent (size) of such devices. A horizontal MOSFET layout is often used in which the associated drain and source regions are placed adjacent one another in a base substrate, with the channel region extending horizontally therebetween. The memory element is formed above either the source or the drain.

Horizontal MOSFETs may require a minimum size of about $4F^2$ where F is the minimum feature dimension of the associated manufacturing process (e.g., F=70 nm, etc.). Since this is significantly larger than the areal size of many types of memory elements, the switching device size can be a limiting factor in achieving greater areal densities in a memory array.

Some recent semiconductor memory designs have proposed a stacked memory cell arrangement whereby the memory element and the transistor are vertically aligned as a pillar, or stack, above a base substrate. In a stacked memory cell, the drain and source regions are located one above the other, with the channel region extending vertically therebetween. While advantageously promoting an enhanced areal data density, it can be difficult to form individual control lines (such as source lines) that interconnect the bottom sides of the memory cells along respective rows or columns in the array.

SUMMARY

Various embodiments of the present invention are generally directed to an apparatus with embedded (bottom side) control lines for vertically stacked semiconductor elements, and a method for forming the same.

In accordance with some embodiments, a multi-wafer structure is formed by providing a first semiconductor wafer with a first facing surface on which a first conductive layer is formed. The first semiconductor wafer is attached to a second semiconductor wafer to form the multi-wafer structure, with the second semiconductor wafer having a second facing surface on which a second conductive wafer is formed.

The first conductive layer is contactingly bonded to the second conductive layer to form an embedded combined conductive layer within the structure. Portions of the embedded combined conductive layer are subsequently removed to form a plurality of spaced apart control lines that extend in a selected length or width dimension through said structure.

These and other features and advantages which characterize the various embodiments of the present invention can be understood in view of the following detailed discussion and accompanying drawings.

DETAILED DESCRIPTION

The present disclosure is generally directed to an apparatus characterized as a multi-wafer structure with embedded (bottom side) control lines, and an associated method for making the same. The embedded control lines provide electrical interconnection with vertically stacked semiconductor elements within the multi-wafer structure.

As explained below, in various embodiments an acceptor wafer is formed that incorporates various control circuitry, and a donor wafer is formed that incorporates a matrix from which individual channel based switching devices are subsequently formed.

The acceptor wafer and the donor wafer are each provided with a metal layer on a respective facing surface. The acceptor and donor wafers are attached to form the multi-wafer structure, and during this attachment process the respective metal layers are brought together to form a single combined metal layer that is embedded within the multi-wafer structure. The combined metal layer is transformed during subsequent processing into individual embedded bottom side control lines (e.g., embedded source lines).

Figure 1:
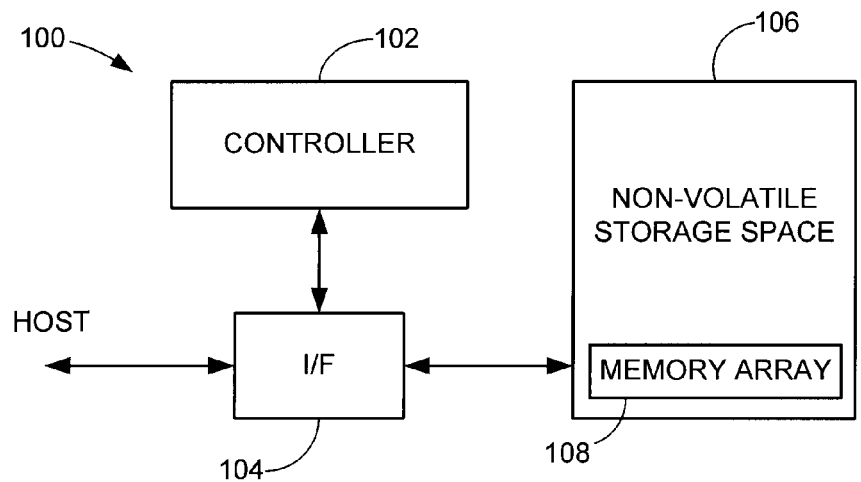
FIG. 1 shows a functional block representation of an exemplary data storage device constructed in accordance with various embodiments of the present invention.

FIG. 1 provides an illustrative device environment in which such processing can be advantageously utilized. In FIG. 1, a data storage device 100 employs semiconductor memory to store data supplied by a host. In some embodiments, the device 100 is characterized as a non-volatile solid state drive (SSD), although such is not limiting.

A programmable controller 102 provides top level control of the device 100 during operation. An interface circuit (I/F) 104 communicates with the host and transfers data to be stored in a semiconductor memory 106.

The semiconductor memory 106 is characterized as a non-volatile storage space formed from one or more arrays 108 of non-volatile memory cells. In other embodiments, the memory 106 can take the form of a volatile memory space such as a DRAM cache. Additional hierarchical memory storage layers can be provided such as a downstream non-volatile main storage (e.g., a magnetic disc, etc.).

Figure 2:
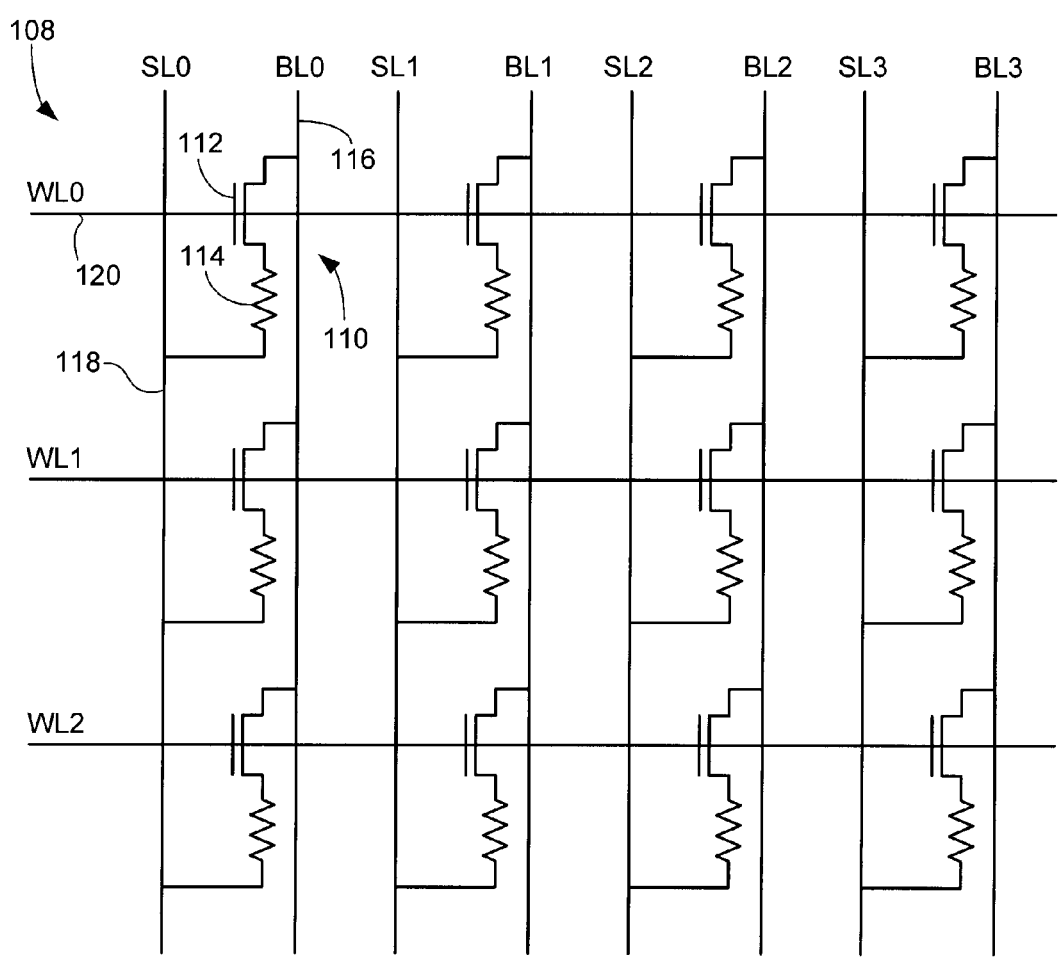
FIG. 2 is a schematic representation of a memory array of the device of FIG. 1.

FIG. 2 is a schematic representation of a portion of the non-volatile array 108 of FIG. 1. The array 108 is formed from a number of memory cells 110 arranged into rows and columns. While only three (3) rows and four (4) columns are shown in FIG. 2, it will be appreciated that any numbers of rows and columns of the cells 110 can be provided.

Each cell 110 in the array 108 includes a switching device 112 connected in series with a resistive memory element 114. In some embodiments, the switching devices 112 are characterized as n-channel MOSFETs (transistors), and the memory elements 114 are programmable resistive sense elements such as but not limited to resistive random access memory (RRAM) elements, spin-torque transfer random access memory (STRAM) elements or programmable metallization cells (PMCs).

A number of bit lines 116 denoted as BL0-BL3 interconnect a first end ("top side") of each of the cells along each column. Source lines 118 denoted as SL0-SL3 interconnect an opposing, second end ("bottom side") of each of the cells along each column. Word lines 120 denoted as WL0-WL2 interconnect the gate regions of the MOSFETs 112 along each row. It will be appreciated that other arrangements and interconnection schemes can be employed, so that the schematic representation of FIG. 2 is merely illustrative and not limiting.

Figure 3:
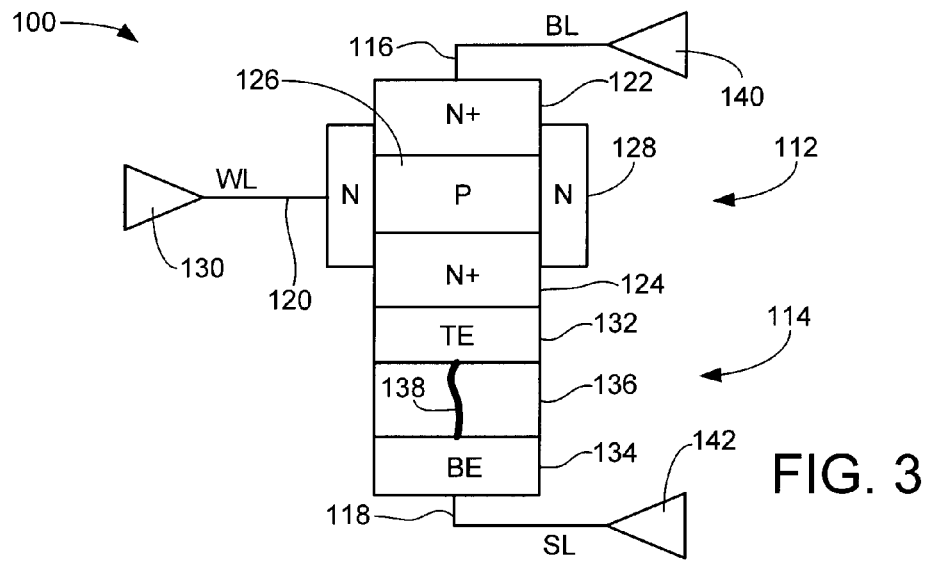
FIG. 3 is a side elevational representation of various semiconductor layers of a vertically stacked memory cell of FIG. 2 in accordance with some embodiments.

FIG. 3 is a layer representation of a selected memory cell 110 from FIG. 2 in accordance with some embodiments. The transistor 112 is formed from respective N+ doped regions 122, 124 separated by a vertically extending P doped channel region 126. An N doped control gate 128 surrounds the channel region 126. Application of a suitable bias voltage from a word line (WL) driver 130 will place the transistor 112 in a forward biased (conductive) state, allowing currents to pass through the memory cell 110 across the drain-source junction.

The memory element 114 is characterized in FIG. 3 as an RRAM element and includes top and bottom electrodes (TE, BE) 132, 134 separated by an intervening barrier layer 136. The intervening barrier layer 136 is formed from an oxide or other electrically insulative material, so that the memory element 114 normally has a relatively high resistance $R_H$.

Application of a suitable write current through the element 114 will induce passage of metal ions from one or both of the electrodes 132, 134 to form one or more electrically conductive filaments 138 across the barrier layer 136. The presence of the filament(s) will provide the memory element 114 with a relatively low resistance $R_L$. The element 114 can be reprogrammed to the initial high resistance $R_H$ state by the application of a suitable write voltage in the opposite direction, which will induce retraction of the metal ions back to the respective electrodes 132, 134.

To program the memory cell 110 to a desired state, the WL driver 130 will assert the WL 120 and respective BL and SL drivers 140, 142 will direct current through the memory element 114 in the appropriate direction and at the appropriate voltage and current magnitudes. The programmed state of the element 114 can be subsequently read by asserting the WL 120, passing a smaller read bias current through the memory cell 110 such as from BL driver 140 to SL driver 142, and comparing the resulting voltage on the BL 116 to a reference voltage using a separate sense amplifier (not shown).

The stacked nature of the memory cell 110 in FIG. 3 provides a number of advantages. The relatively small areal extent of the memory cell allows arrays such as in FIG. 2 to achieve relatively high areal densities. However, a limitation with stacked memory cells such as set forth in FIG. 3 relates to establishing access to the bottom side of the memory cell; that is, it has been found difficult to establish an electrical interconnection such as that shown in FIG. 3 between the SL driver 142 and the BE 134.

Figure 4A:
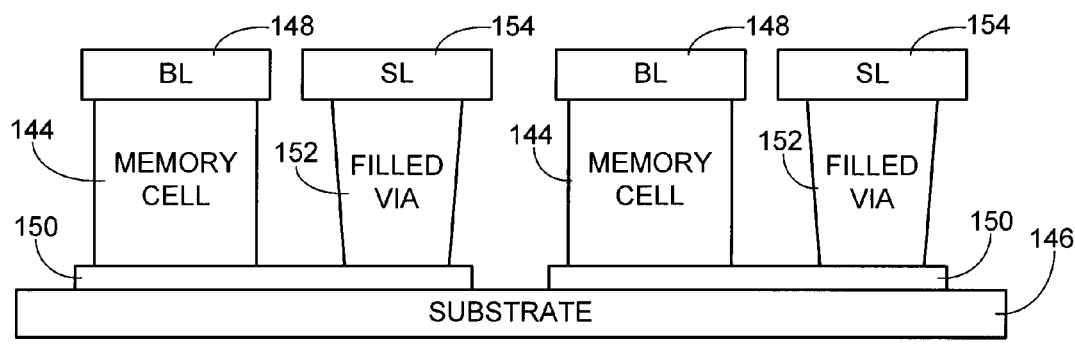
FIGS. 4A-4B show prior art approaches to establishing bottom side interconnection to vertically stacked memory cells such as set forth in FIG. 3.

One prior art solution uses filled via structures such as depicted in FIG. 4A. In this approach, individual stacked memory cells 144 are supported above a base substrate 146, and bit lines 148 are connected to the tops of the memory cells 144. Bottom-side connections can be made using embedded conductive pads 150 and vias 152 that are disposed adjacent the memory cells 144 and filled with a conductive material. Source lines 154 are connected to the top sides of the vias 152, so that the source lines run adjacent the bit lines 148 across the top of the array.

While operable, it can be appreciated that the approach in FIG. 4A reduces areal density of the array due to the additional space required for the filled vias 152. The approach in FIG. 4A may further require enhanced manufacturing complexities and costs to form the vias and the conductive pad interconnections.

Figure 4B:
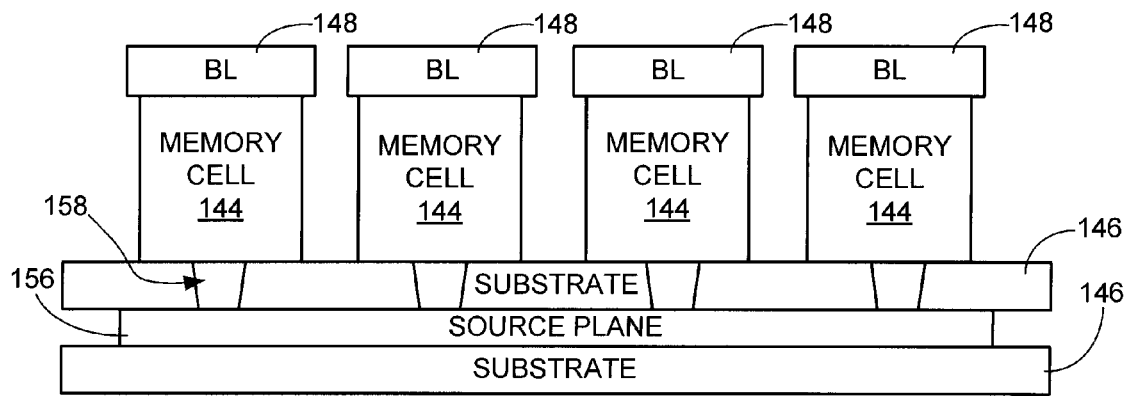

Another prior art solution that has been employed with stacked cells is the use of a common source plane (SP), such as depicted at 156 in FIG. 4B. The source plane 156 extends below the respective stacked memory cells 144 so that all of the memory cells in the array are interconnected to the source plane, such as through vias 158 that extend through an upper oxide substrate 146. As before, individual rows (or columns) of the memory cells are interconnected via separate bit lines 148.

While operable, limitations with FIG. 4B include the enhanced processing and cost to form the metallization of the entire source plane, as well as limitations during operation in that currents generally cannot be passed through two or more cells concurrently in opposing directions. Other prior art solutions include additional interconnection layers and contact layers to accommodate the bottom side interconnections for the stacked memory cells.

Figure 5A:
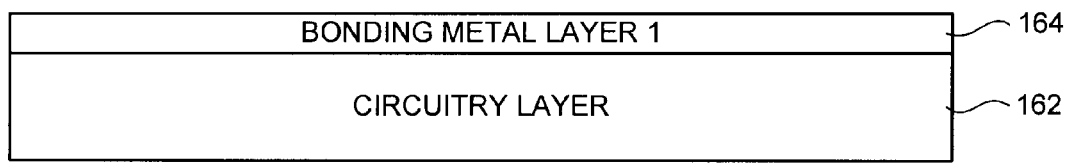
FIG. 5A shows an acceptor wafer constructed in accordance with some embodiments.
Figure 5B:
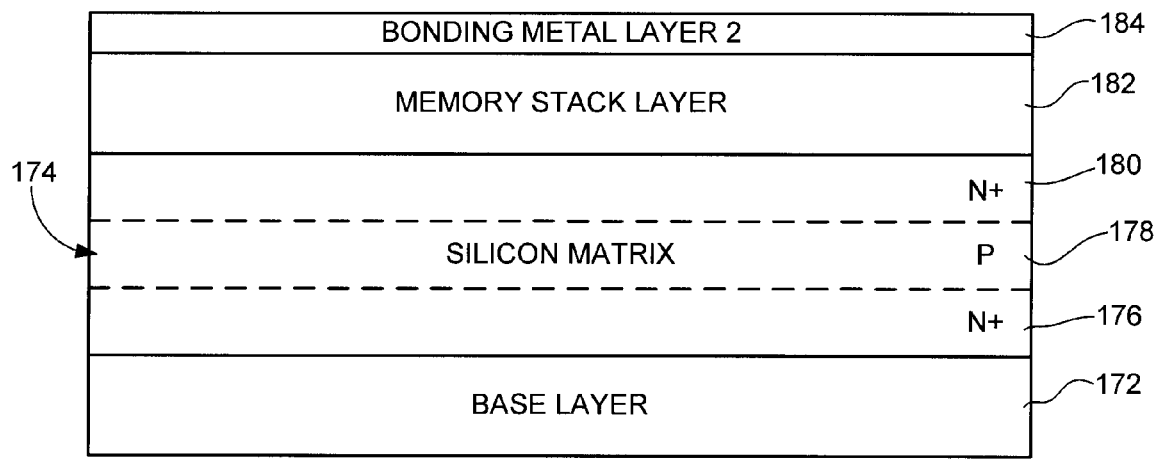
FIG. 5B shows a donor wafer constructed in accordance with some embodiments.

Accordingly, various embodiments of the present invention are generally directed to a manufacturing process that efficiently and easily forms bottom-side control lines (e.g., source lines) for an array of vertically stacked memory cells. To illustrate such processing, reference is first made to FIGS. 5A and 5B which respectively show an acceptor (A) wafer 160 and a donor (D) wafer 170. In some embodiments, the wafers 160, 170 are silicon based substrates which are separately formed with a number of initial, respective features.

The acceptor wafer 160 includes a circuit layer 162 in which various control circuits, including CMOS circuitry, are formed during prior processing. This circuitry may include the various drivers shown in FIG. 3, as well as other control circuitry used in conjunction with the cells 110. The circuit layer 162 may also include contacts for the various vertical transistors. A first conductive metal layer 164 is formed on a top facing surface of the circuit layer 162. The metal layer 164 can be formed of any suitable metals or metal alloys. As desired, the metal layer can include multiple layers of conductive and dielectric materials, and provides a relatively low resistance per unit length.

The donor wafer 170 includes a number of layers including a base layer 172, which may be a bulk oxide. A doped silicon matrix 174 is formed in the base layer, and includes regions 176, 178 and 180 of respective NPN doping levels to ultimately form the respective drain, source and channel regions 122, 124 and 126 in FIG. 3. The doped regions can be formed using ion implantation or other techniques.

A memory element layer 182 is provided on the silicon matrix 174, and includes a number of layers to form a memory element such as the layers 132, 134 and 136 in FIG. 3. As will be appreciated, the particular format of the memory layer 182 will depend on the style of memory element 114 to be used in the completed memory cells 110. A second conductive metal layer 184 is formed on a top facing surface of the memory layer 182. The material composition of the second metal layer 184 may be the same, or different from, the first metal layer 164.

Figure 6:
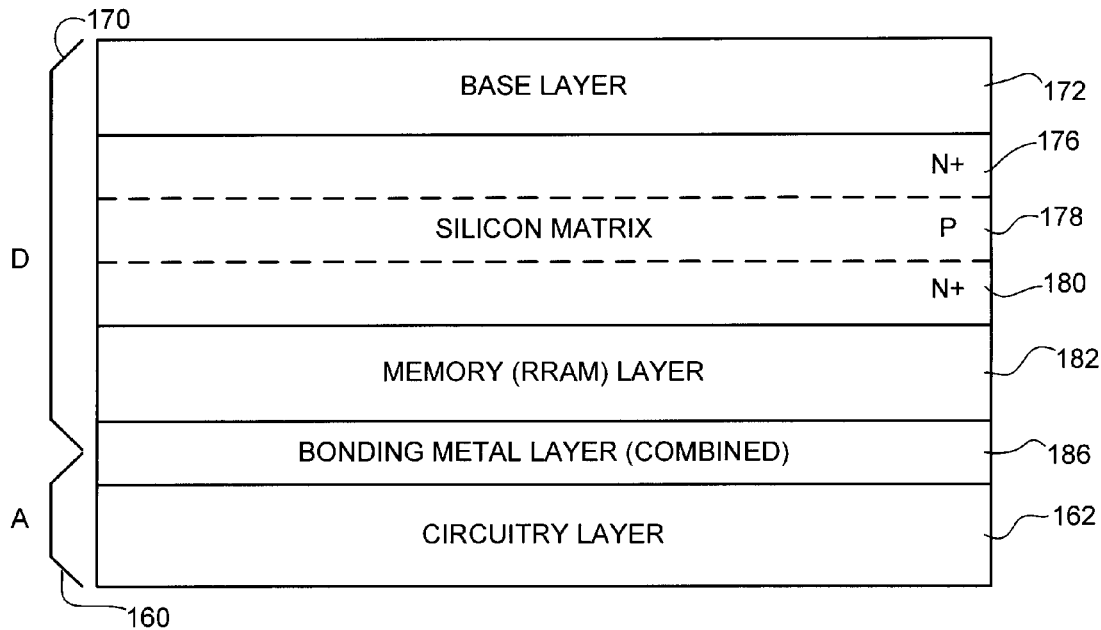
FIG. 6 shows a multi-wafer structure formed by attachment of respective conductive layers of the acceptor and donor wafers of FIGS. 5A-5B to form a combined conductive wafer embedded within the multi-wafer structure.

The respective wafers 160, 170 are mated as shown in FIG. 6 to form a multi-wafer structure. The donor wafer 170 is inverted relative to the acceptor wafer 160 and the first and second metal layers 164, 184 are bonded together to provide a combined metal layer 186. Any number of suitable bonding processes can be utilized, including reflow heating. Additional materials can be introduced to establish the metalized layer 186 interconnection during the bonding process.

As will become apparent from the following discussion, the individual control (source lines) are eventually formed from this metal layer 186, so the metal layer can be characterized as a planar extent of conductive material with a substantially uniform thickness and overall length and width dimensions substantially corresponding to the overall length and width dimensions of the multi-wafer structure. In this way, the finished control lines will fully extend across the array in parallel, spaced apart fashion in the desired direction (e.g., in the row direction or the column direction, as required).

Figure 7A:
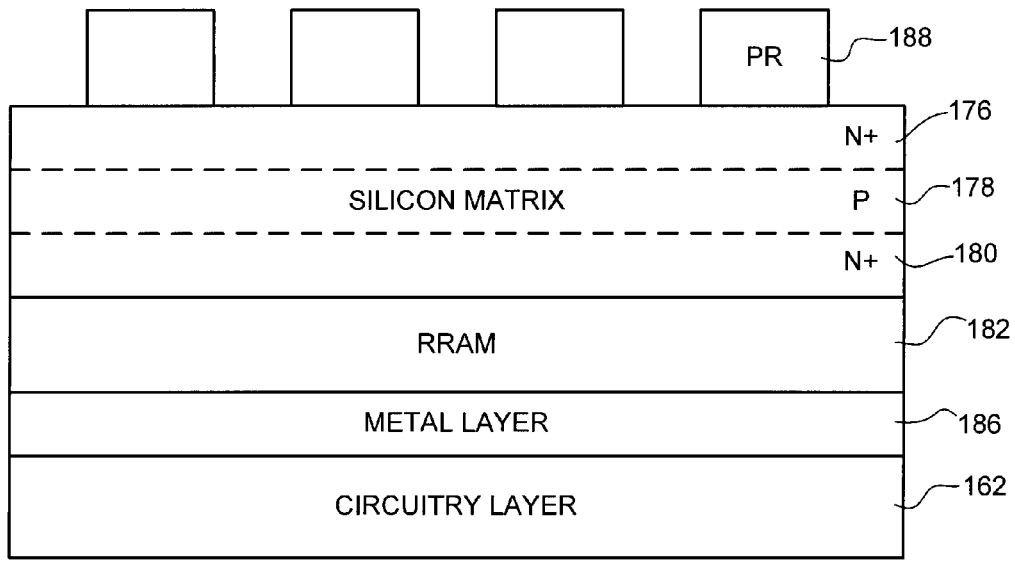
FIGS. 7A-7B provide respective side elevational and top plan views of the structure of FIG. 6 to which dots of photoresist (PR) material have been applied.
Figure 7B:
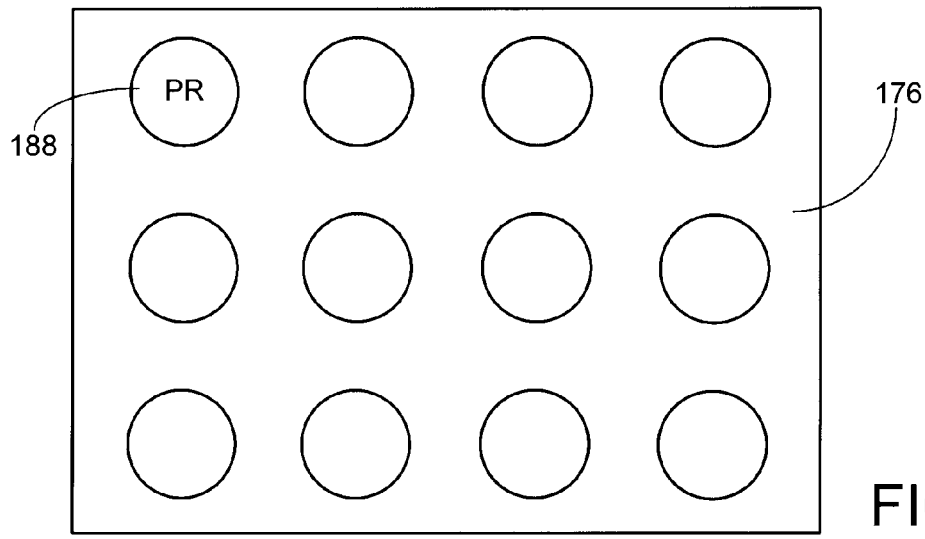
Figure 8:
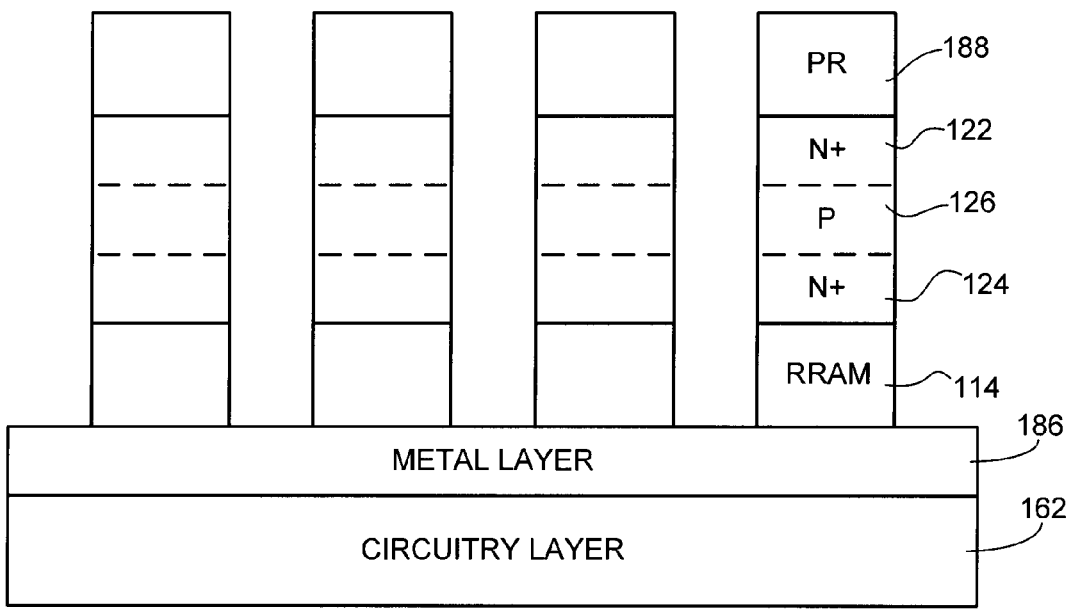
FIG. 8 represents application of an etching process to the structure of FIGS. 7A-7B to form a plurality of spaced apart stacked pillars of semiconductor material arranged into rows and columns.

The base oxide layer 172 is removed and localized areas (dots) of photoresist (PR) 188 are applied to the top of the silicon matrix, as shown in FIGS. 7A-7B. The dots of PR 188 are circular in shape in the illustrated embodiment to provide a cylindrical cross-sectional shape for the cells, although other cross-sectional shapes can be alternatively provided. An etching process is next carried as set forth by FIG. 8, which removes all of the material not covered by the dots of PR 188 down to the metal layer 186. At the end of this etching process, spaced apart pillars, or vertical stacks, of layers will be left which correspond to the individual memory cells as set forth in FIG. 3.

Figure 9A:
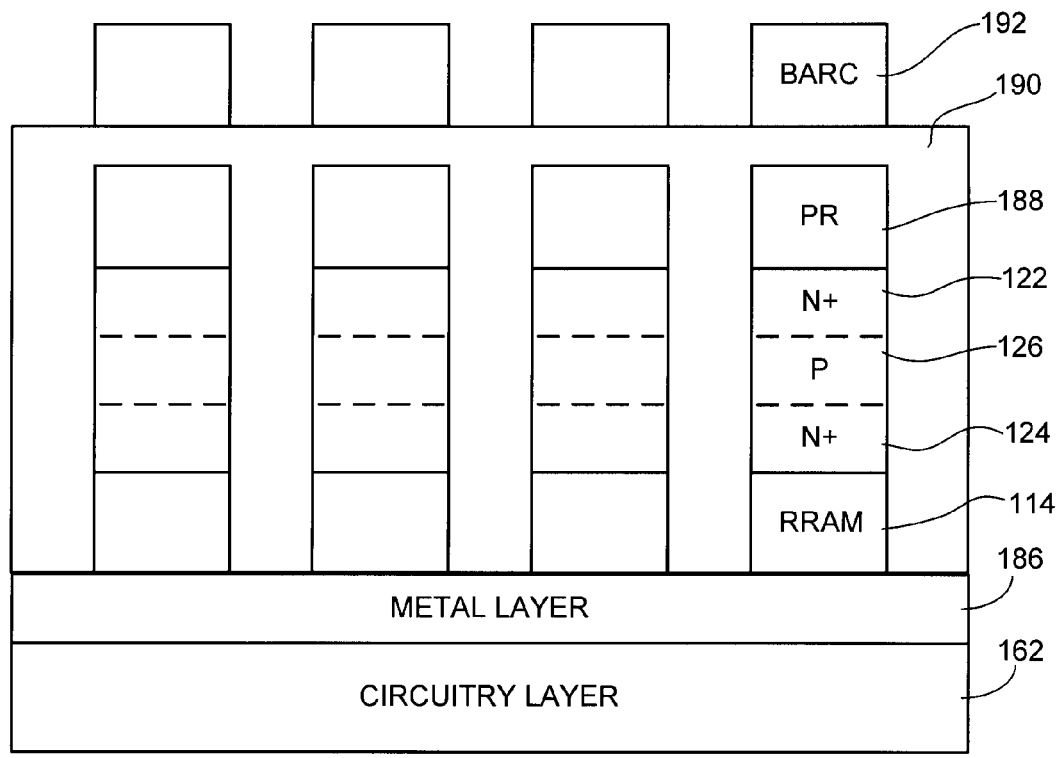
FIGS. 9A-9B illustrate respective side elevation and top plan views of the application of masking material to form embedded control lines from the combined conductive layer within the structure.
Figure 9B:
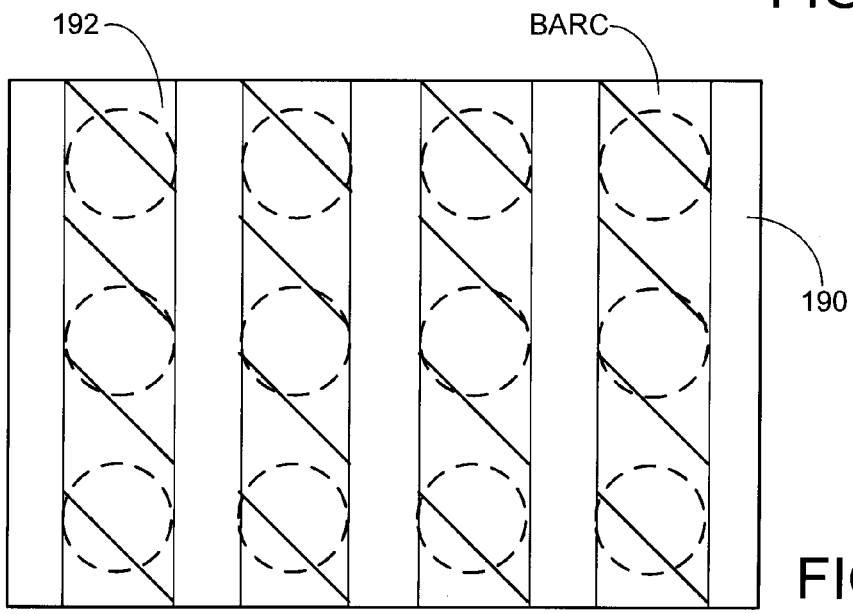

A hard mask is applied as shown in FIGS. 9A-9B to form the individual control (source) lines. Organic material 190 is deposited between the layers and, as desired, a bottom anti-reflective coating (BARC) or other photolithography masking material 192 can be applied to aid the process. The masking material 192 extends across the top of the organic material 190 over the respective stacks as depicted in cross-hatched fashion in FIG. 9B.

Figure 10:
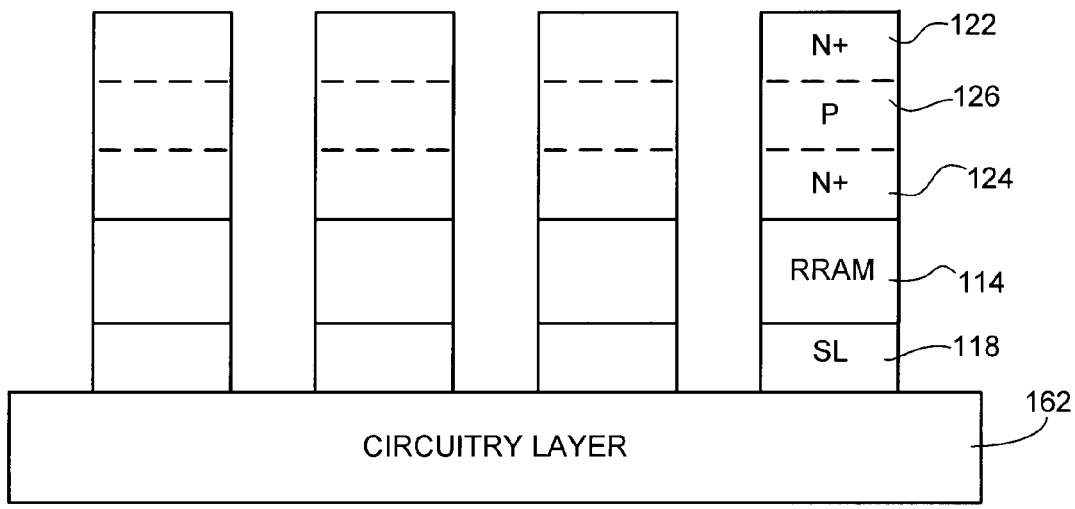
FIG. 10 shows an elevational view of the resulting plurality of embedded control lines formed using the masking material of FIGS. 9A-9B.

An etching process is carried out in FIG. 10 to form the source lines 118. The etching removes the organic material and portions of the conductive layer 186 down to the underlying circuitry layer 162, so that the resulting source lines run under the columns of stacks as shown in FIG. 9B. The photoresist PR 188, organic material 190 and masking material 192 on the top of each stack are also removed at this point.

Figure 11A:
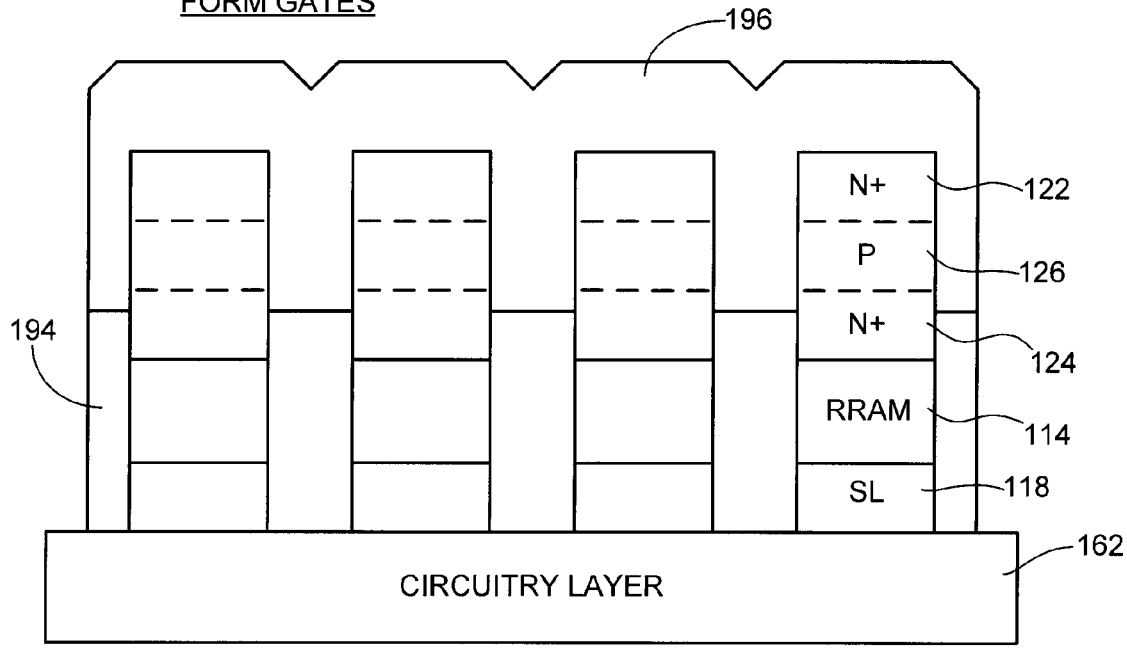
FIGS. 11A-11D show a sequence in which gate structures are formed.

Gate structures for the transistors 112 are next formed as set forth in FIGS. 11A-11D. An underlying dielectric material, such as an oxide 194, is deposited around the bases of the stacks up to the desired height, and an appropriate semiconductor gate material 196 such as silicon is deposited on top of the oxide 194 to fully enclose the stacks, as shown in FIG. 11A. The semiconductor material can be doped via ion implantation at this time. A suitable masking and etching process removes the semiconductor material down to form the gate structures as generally depicted at 128 in FIG. 3.

Figure 11B:
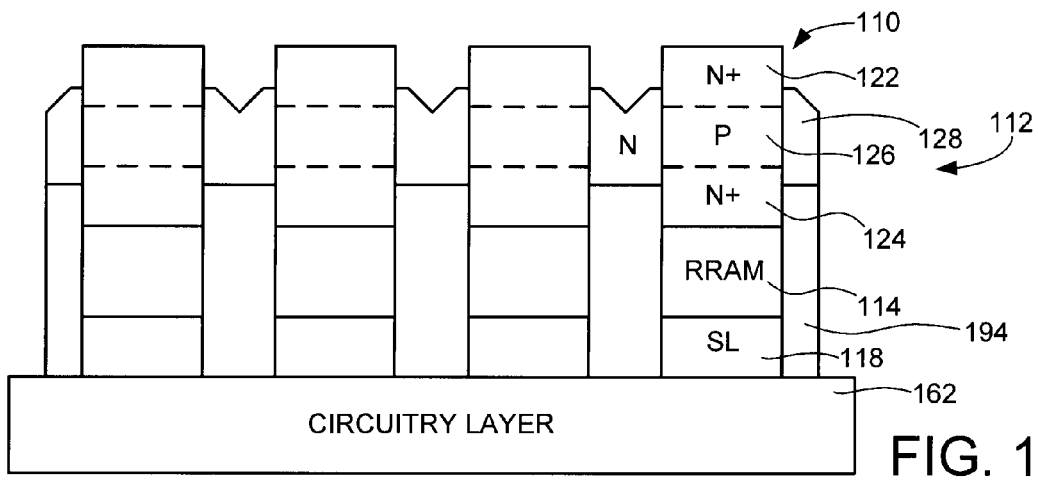
Figure 11C:
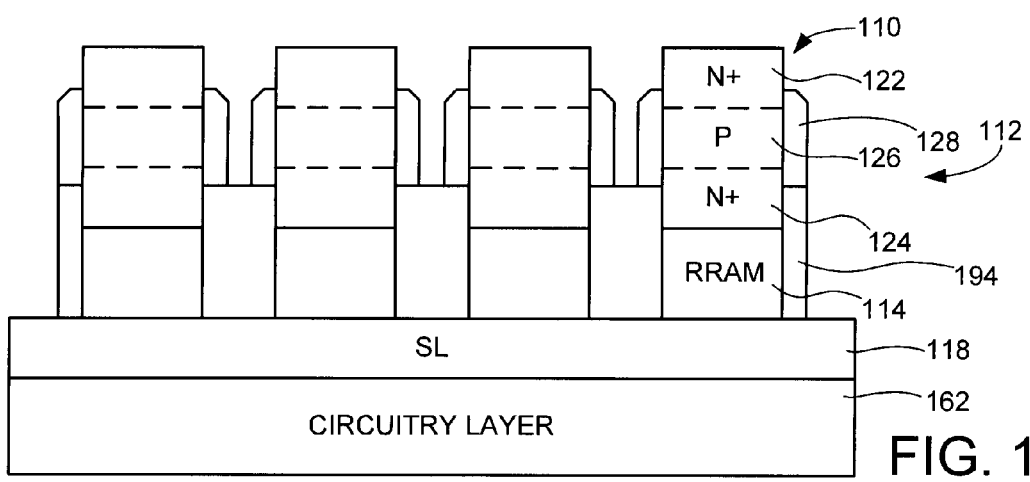
Figure 11D:
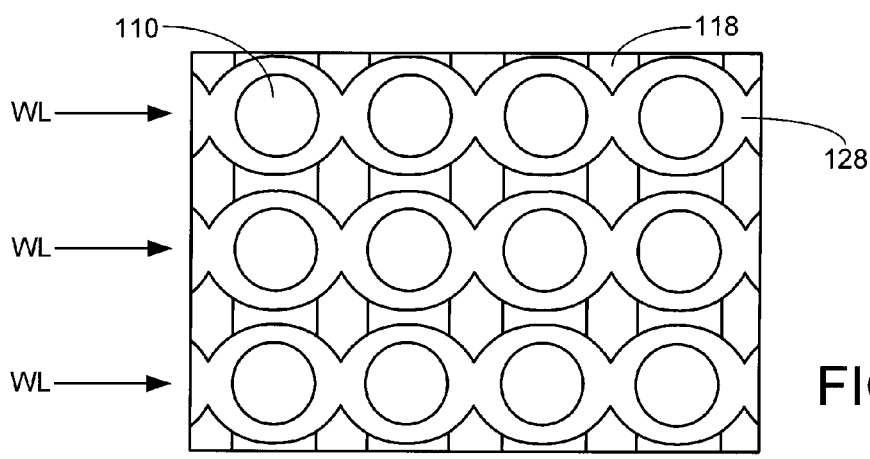

FIG. 11B shows a row of the cells; FIG. 11C shows a column of the cells; and FIG. 11D shows a top plan representation of the cells. As can be seen from these drawings, the gate structures 128 are interconnected along each row to form the aforementioned word lines 120, and the gate structures of each selected row are electrically isolated from those of the adjacent rows.

Figure 12A:
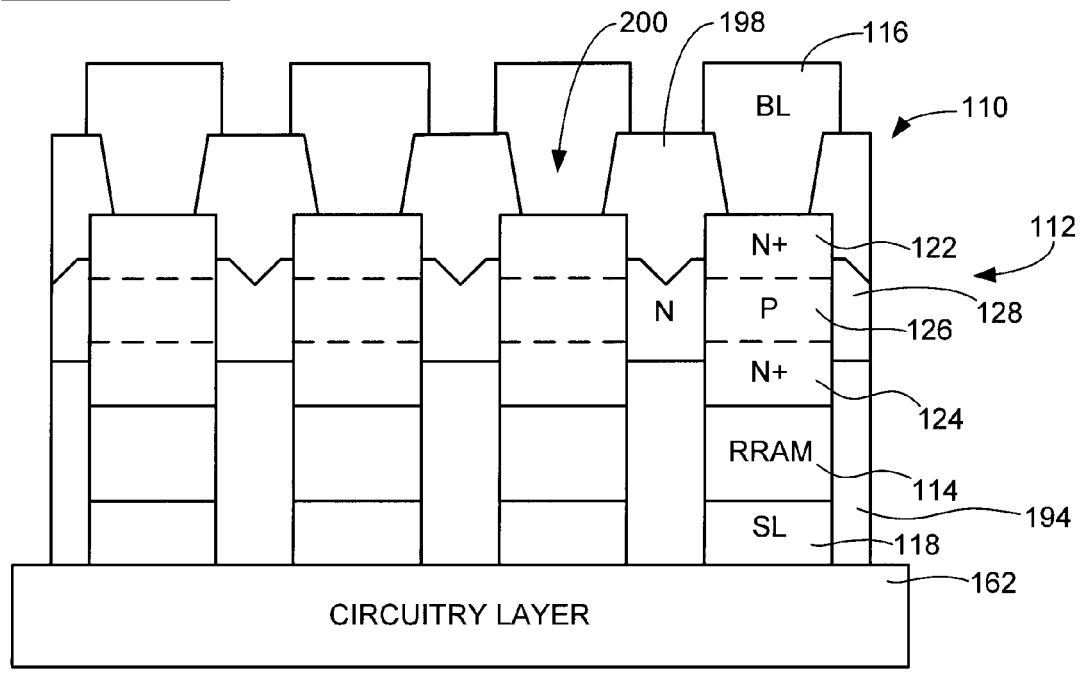
FIGS. 12A-12B illustrate subsequent formation of spaced apart bit lines across the top side of the pillars of semiconductor material.
Figure 12B:
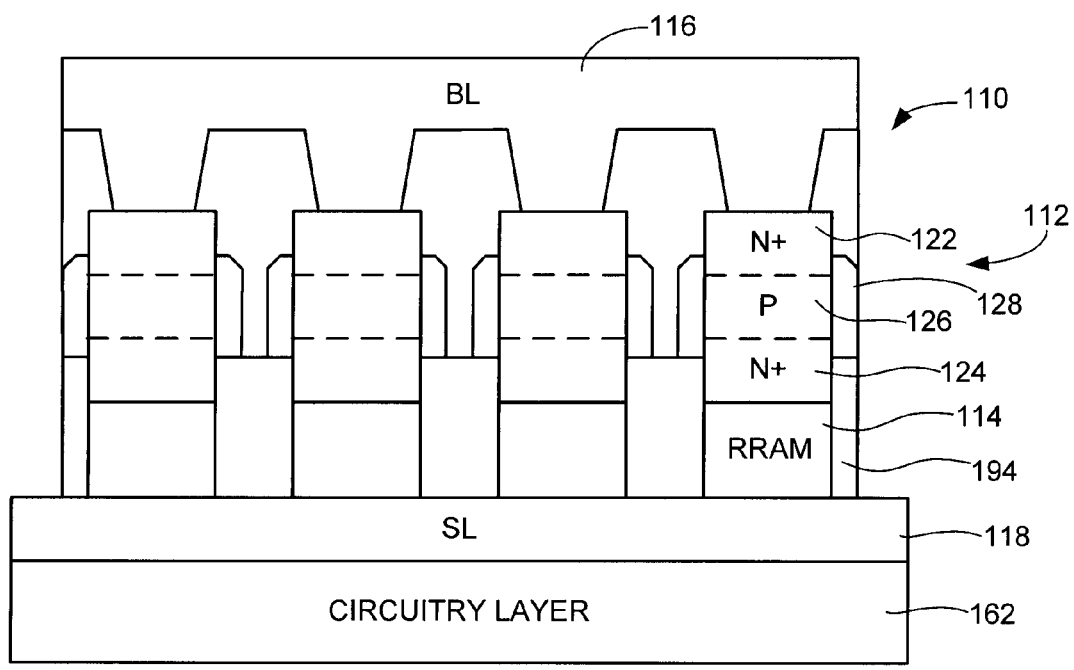

Top side bit lines (116 in FIGS. 2-3) are next formed in FIGS. 12A-12B. In some embodiments, a layer of oxide 198 or other dielectric is deposited onto the memory cells as shown in FIG. 12A. This oxide 198 fills the areas between adjacent gate structures 126 and forms a uniformly thick layer above the top elevation of the cells. Vias 200 are formed in this oxide layer and filled with conductive material using a physical vapor deposition or other suitable process.

The deposited material forms a layer of uniform thickness that covers the length and width dimensions of the overall array. Suitable masking and etching processing (not separately depicted) removes portions of this material to form the parallel, spaced apart bit lines 116 as shown. FIG. 12A shows the completed memory cells 110 along a selected row, and FIG. 12B shows the completed memory cells along a selected column. It will be noted that in this embodiment the bit lines 116 and source lines 118 are parallel and orthogonal to the word lines 120, corresponding to the schematic depiction of FIG. 2. The processing disclosed herein can provide other arrangements and orientations of these respective control lines as required.

Figure 13A:
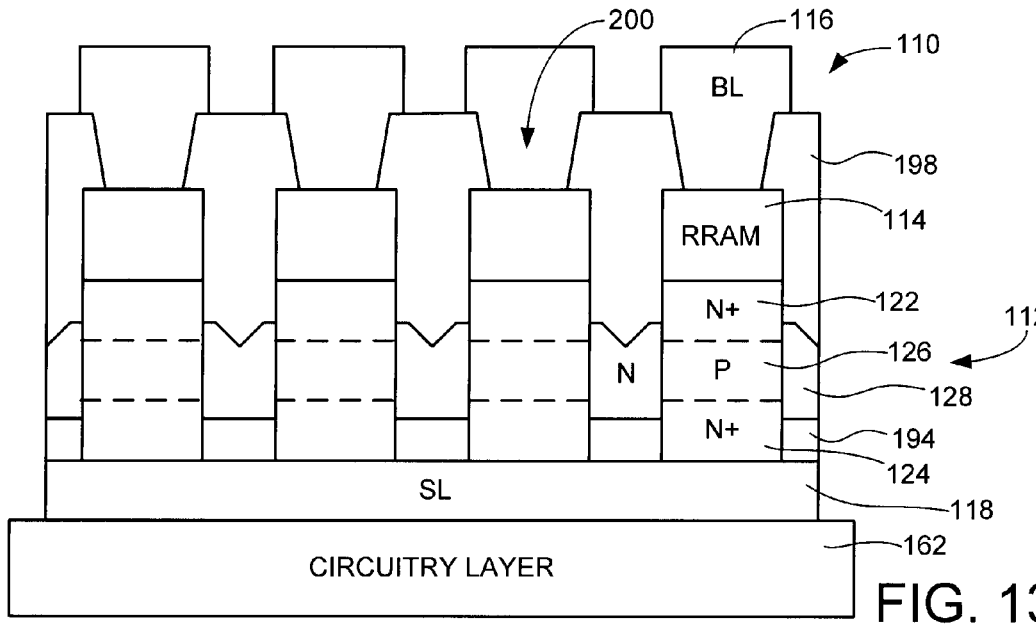
FIGS. 13A-13B provide an alternative configuration for the multi-wafer structure in accordance with various embodiments.
Figure 13B:
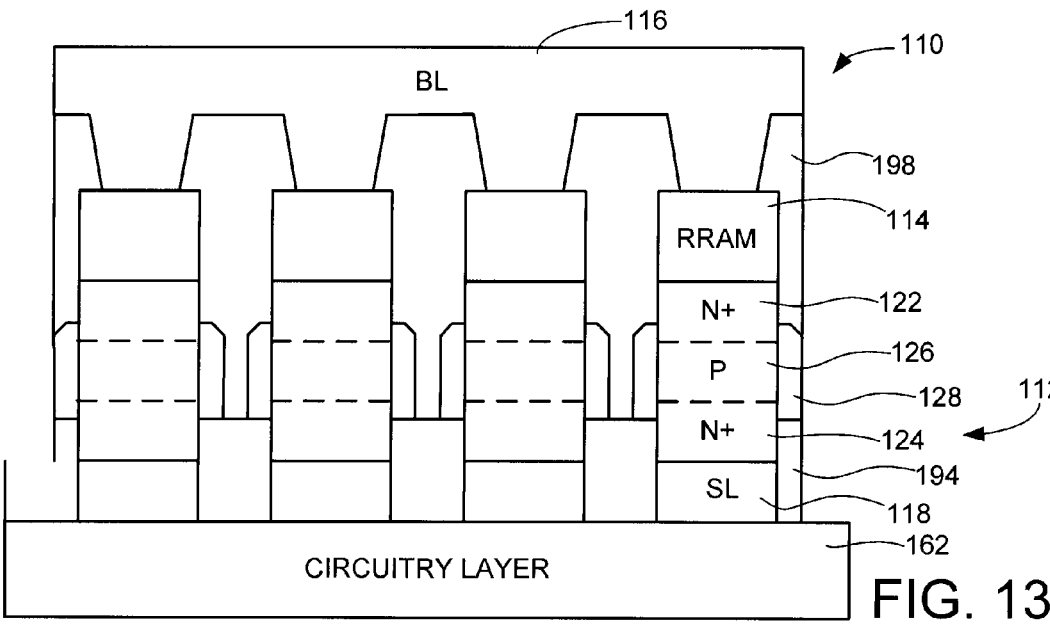

FIGS. 13A and 13B show an alternative operation of the foregoing process to provide an array with memory cells 110A. As before, FIG. 13A shows a row of cells and FIG. 13B shows a column of cells. The memory cells 110A are similar to the memory cells 110 except that the memory element 114 is located above the switching device 112 in FIGS. 13A-13B. These figures also show an alternative orientation of the source lines 116, which are orthogonal to the bit lines 118 and parallel with the word lines 120. That is, both the source lines 118 and the word lines 120 are connected along each row in the array.

It will now be appreciated that the various embodiments as presented herein provide a number of advantages over the prior art. Spaced apart bottom side control lines can be easily and efficiently formed during manufacturing, eliminating the need for additional interconnections and conductive layers. Unlike top side interconnection techniques, the present process allows the source lines to run independently of the bit lines. Enhanced data densities can be achieved and multiple concurrent access operations can be carried out on different parts of the array, as desired.

While the various embodiments presented herein have utilized the disclosed process to form non-volatile memory cells, it will be appreciated that such is not limiting. For example, volatile memory cells can just as readily be formed using the foregoing steps modified as necessary to meet the requirements of a given application. Also, the disclosed process can be used in other applications not necessarily limited to stacked memory cells, such as an array of switchable channel elements.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. An apparatus comprising a multi-layer structure of semiconductor material formed by steps comprising:
   providing a first semiconductor wafer with a first facing surface on which a first conductive layer is formed, the first semiconductor wafer comprises an embedded silicon matrix of respectively doped regions corresponding to a metal oxide semiconductor field effect transistor and a memory element layer is provided on the silicon matrix of respectively doped regions corresponding to a metal oxide semiconductor field effect transistor and the memory element layer separates the first conductive layer from the silicon matrix of respectively doped regions corresponding to a metal oxide semiconductor field effect transistor;
   attaching the first semiconductor wafer to a second semiconductor wafer to form the multi-wafer structure, the second semiconductor wafer having a second facing surface on which a second conductive layer is formed, wherein the first conductive layer is contactingly bonded to the second conductive layer to form an embedded combined conductive layer within said structure;
   removing portions of the embedded combined conductive wafer to form a plurality of spaced apart control lines that extend in a selected length or width dimension through said structure;
   further comprising a plurality of spaced apart stacked pillars of semiconductor material formed by removing material from the first semiconductor wafer, the pillars arranged into rows and columns, and wherein respective rows or columns of the pillars are contactingly supported by the respective control lines;
   wherein each of the pillars comprise a non-volatile memory element electrically between and separating the metal oxide semiconductor field effect transistor and the respective control line; and
   wherein the multi-wafer structure is characterized as a solid state memory comprising individual memory cells coupled to said plurality of control lines, wherein the individual memory cells are formed in the first semiconductor wafer after the spaced apart control lines are formed, and wherein control circuitry coupled to said memory elements is formed in the second semiconductor wafer prior to the formation of the spaced apart control lines.

2. The apparatus of claim 1, wherein the control lines are characterized as embedded source lines, and wherein the structure further comprises a plurality of spaced apart bit lines that extend across and are coupled to respective rows or columns of said pillars.

3. The apparatus of claim 2, wherein the source lines are parallel with the bit lines.

4. The apparatus of claim 2, wherein the source lines are orthogonal to the bit lines.

5. The apparatus of claim 1, wherein the control lines are characterized as embedded source lines that interconnect respective rows or columns of memory cells formed in the first semiconductor layer.

6. An apparatus comprising a multi-layer structure of semiconductor material formed by steps comprising:
   providing a first semiconductor wafer with a first facing surface on which a first conductive layer is formed, the first semiconductor wafer comprises an embedded silicon matrix of respectively doped regions corresponding to a metal oxide semiconductor field effect transistor and a memory element layer is provided on the silicon matrix of respectively doped regions corresponding to a metal oxide semiconductor field effect transistor and the memory element layer separates the first conductive layer from the silicon matrix of respectively doped regions corresponding to a metal oxide semiconductor field effect transistor;
   attaching the first semiconductor wafer to a second semiconductor wafer to form the multi-wafer structure, the second semiconductor wafer having a second facing surface on which a second conductive layer is formed, wherein the first conductive layer is contactingly bonded to the second conductive layer to form an embedded combined conductive layer within said structure; and
   removing material from the first semiconductor wafer to form a plurality of spaced apart stacked pillars of semiconductor material and each pillar comprises a resistive random access memory element between the metal oxide semiconductor field effect transistor and the embedded combined conductive layer; thereafter
   removing portions of the embedded combined conductive layer to form a plurality of spaced apart control lines that extend in a selected length or width dimension through said structure; and
   wherein the multi-wafer structure is characterized as a solid state memory comprising individual memory cells coupled to said plurality of control lines, wherein the individual memory cells are formed in the first semiconductor wafer after the spaced apart control lines are formed, and wherein control circuitry coupled to said memory elements is formed in the second semiconductor wafer prior to the formation of the spaced apart control lines.

7. The apparatus of claim 6, wherein the control lines are characterized as embedded source lines, and wherein the method further comprises forming a plurality of spaced apart bit lines that extend across and are coupled to respective sets of said pillars.

8. The apparatus of claim 6, wherein the control lines are characterized as embedded source lines that interconnect respective rows or columns of memory cells subsequently formed in the first semiconductor layer.

9. The apparatus of claim 6, wherein the resistive random access memory element comprises a programmable metallization cell connected to a channel based switching device.

10. An apparatus comprising a multi-layer structure of semiconductor material formed by steps comprising:

providing a first semiconductor wafer with a first facing surface on which a first conductive layer is formed, the first semiconductor layer comprises an embedded silicon matrix of respectively doped regions corresponding to a metal oxide semiconductor field effect transistor and a memory element layer is provided on the silicon matrix of respectively doped regions corresponding to a metal oxide semiconductor field effect transistor and the memory element layer separates the first conductive layer from the silicon matrix of respectively doped regions corresponding to a metal oxide semiconductor field effect transistor;

attaching the first semiconductor wafer to a second semiconductor wafer to form a multi-wafer structure, the second semiconductor wafer having a second facing surface on which a second conductive layer is formed, wherein the first conductive layer is contactingly bonded to the second conductive layer to form an embedded combined conductive layer within said structure;

removing material from the first semiconductor wafer to form a plurality of spaced apart stacked pillars of semiconductor material and each pillar comprises a resistive random access memory element formed from the memory element layer between the metal oxide semiconductor field effect transistor and the embedded combined conductive layer; thereafter removing portions of the embedded combined conductive layer to form a plurality of spaced apart control lines that extend in a selected length or width dimension through said structure, and wherein said control lines contact said resistive random access memory element and respective sets of the pillars are contactingly supported by the respective control lines and the resistive random access memory element is electrically between the metal oxide semiconductor field effect transistor and the control lines; and wherein the resistive random access memory element comprises a spin-torque transfer random access memory element; and wherein the multi-wafer structure is characterized as a solid state memory comprising individual memory cells coupled to said plurality of control lines, wherein the individual memory cells are formed in the first semiconductor wafer after the spaced apart control lines are formed, and wherein control circuitry coupled to said memory elements is formed in the second semiconductor wafer prior to the formation of the spaced apart control lines.

11. The apparatus of claim 10, wherein the combined conductive layer is characterized as a planar layer of material of substantially uniform thickness with overall length and width dimensions that substantially correspond to overall length and width dimensions of the structure.

12. The apparatus of claim 10, wherein the control lines are characterized as embedded source lines, and wherein the method further comprises forming a plurality of spaced apart bit lines that extend across and are coupled to respective sets of said pillars.

13. The apparatus of claim 12, wherein the source lines are parallel with the bit lines.

14. The apparatus of claim 12, wherein the source lines are orthogonal to the bit lines.

15. The apparatus of claim 10, wherein the control lines are characterized as embedded source lines that interconnect respective rows or columns of memory cells subsequently formed in the first semiconductor layer.

* * * * *